(12) United States Patent
Ades

(10) Patent No.: US 10,176,749 B2
(45) Date of Patent: Jan. 8, 2019

(54) ELECTRONIC BOOK

(71) Applicant: John Anthony Ades, Fresh Meadows, NY (US)

(72) Inventor: John Anthony Ades, Fresh Meadows, NY (US)

( * ) Notice: Subject to any disclaimer, the term of this patent is extended or adjusted under 35 U.S.C. 154(b) by 45 days.

(21) Appl. No.: 15/483,640

(22) Filed: Apr. 10, 2017

(65) Prior Publication Data

US 2018/0293931 A1  Oct. 11, 2018

(51) Int. Cl.
*G09G 3/20* (2006.01)
*G06F 3/0354* (2013.01)
*G06F 1/16* (2006.01)
G09G 3/3208 (2016.01)
G09G 3/34 (2006.01)
H01L 27/32 (2006.01)

(52) U.S. Cl.
CPC ......... *G09G 3/2096* (2013.01); *G06F 1/1616* (2013.01); *G06F 1/1643* (2013.01); *G06F 1/1654* (2013.01); *G06F 3/03545* (2013.01); *G09G 3/3208* (2013.01); *G09G 3/344* (2013.01); *G09G 2300/023* (2013.01); *H01L 27/3267* (2013.01); *H01L 27/3286* (2013.01)

(58) Field of Classification Search
CPC .... G09G 3/2096; G09G 3/3208; G09G 3/344; G09G 2300/023; G09G 2300/0426; G09G 2320/041; G06F 1/167; G06F 1/1616; G06F 1/1643; G06F 1/1654; G06F 3/03545; G06F 3/041; G06F 3/0412; H01L 27/3267; H01L 27/3286

See application file for complete search history.

(56) References Cited

U.S. PATENT DOCUMENTS

| | | | | |
|---|---|---|---|---|
| 7,509,270 B1* | 3/2009 | Hendricks | ............... | G06Q 30/02 705/26.9 |
| 2005/0106548 A1* | 5/2005 | Weiner | .................. | G09B 5/062 434/317 |
| 2006/0139308 A1* | 6/2006 | Jacobson | ................ | G02F 1/167 345/107 |
| 2010/0328264 A1* | 12/2010 | Yip | ..................... | G06F 15/0283 345/174 |
| 2011/0043435 A1* | 2/2011 | Hebenstreit | .......... | G02B 26/005 345/5 |
| 2012/0098752 A1* | 4/2012 | Glenn | ................... | G06F 1/1616 345/173 |
| 2012/0304053 A1* | 11/2012 | Yamaguchi | ........... | G06F 1/1677 715/251 |

(Continued)

*Primary Examiner* — Tom V Sheng

(74) *Attorney, Agent, or Firm* — Boag | Law, PLLC

(57) ABSTRACT

An electronic book is disclosed in which a spine housing system electronics supports one or more display panels, each display panel being configured with a transparent layer such as E-ink, and a light-emitting layer, such as an organic light-emitting diode layer. In embodiments of the invention, the layers may be stacked and fitted to a substrate. In further embodiments, multiple display panels may be joined to the spine to provide the appearance of a traditional book or notebook. A microprocessor in the spine may control the display panels and receive user input to alternately activate the layers in a display panel. A pen may be provided for interacting with the device and activating specific layers within a display panel.

11 Claims, 15 Drawing Sheets

(56) References Cited

U.S. PATENT DOCUMENTS

| | | | |
|---|---|---|---|
| 2013/0194205 A1* | 8/2013 | Park | G06F 3/044 |
| | | | 345/173 |
| 2015/0228217 A1* | 8/2015 | Perdices-Gonzalez | ...................... |
| | | | G09G 3/348 |
| | | | 345/5 |
| 2016/0140908 A1* | 5/2016 | Zhang | G02F 1/167 |
| | | | 345/214 |
| 2016/0284323 A1* | 9/2016 | Neugebauer | G09G 5/397 |
| 2017/0176835 A1* | 6/2017 | Gupta | G02B 6/0073 |

\* cited by examiner

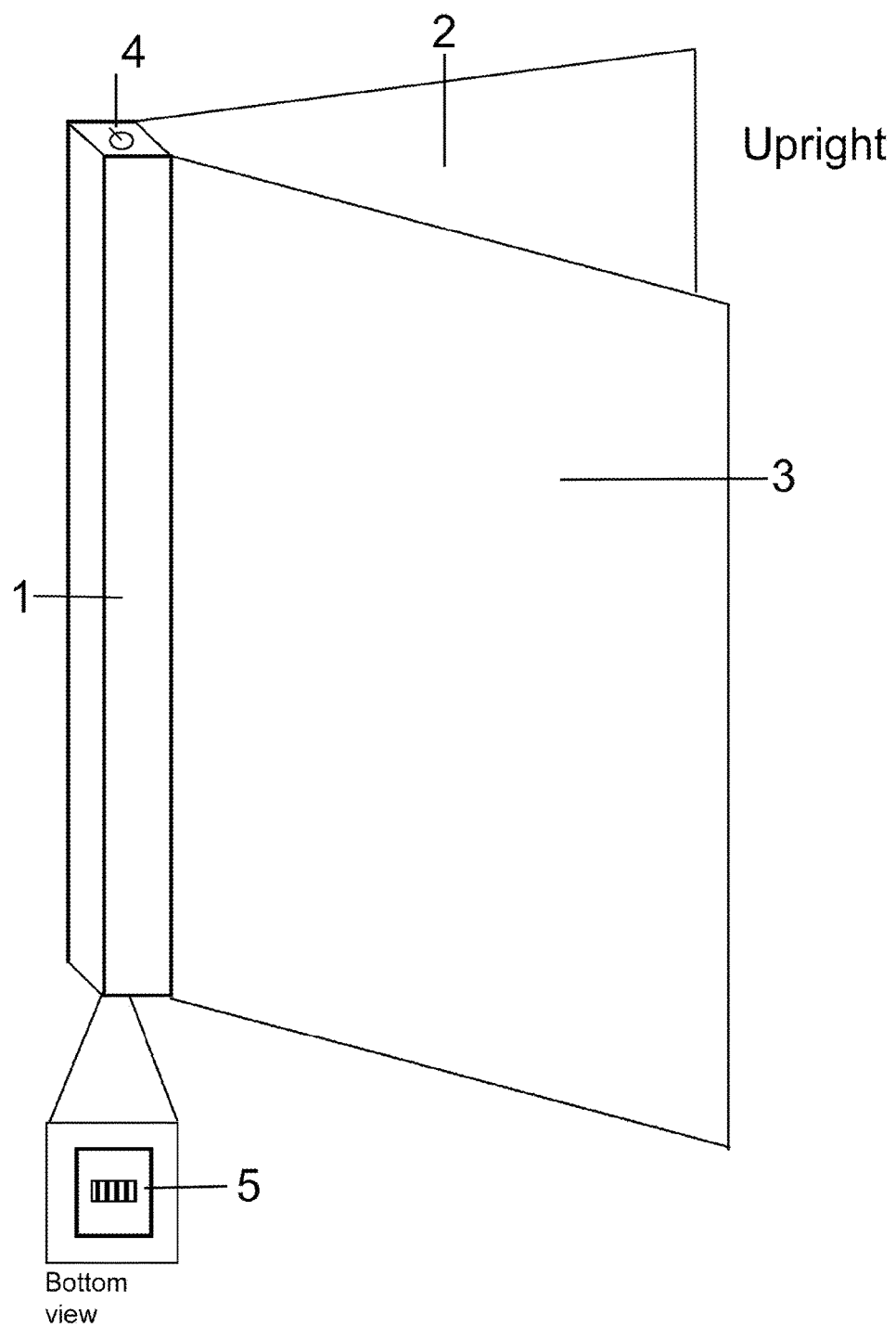

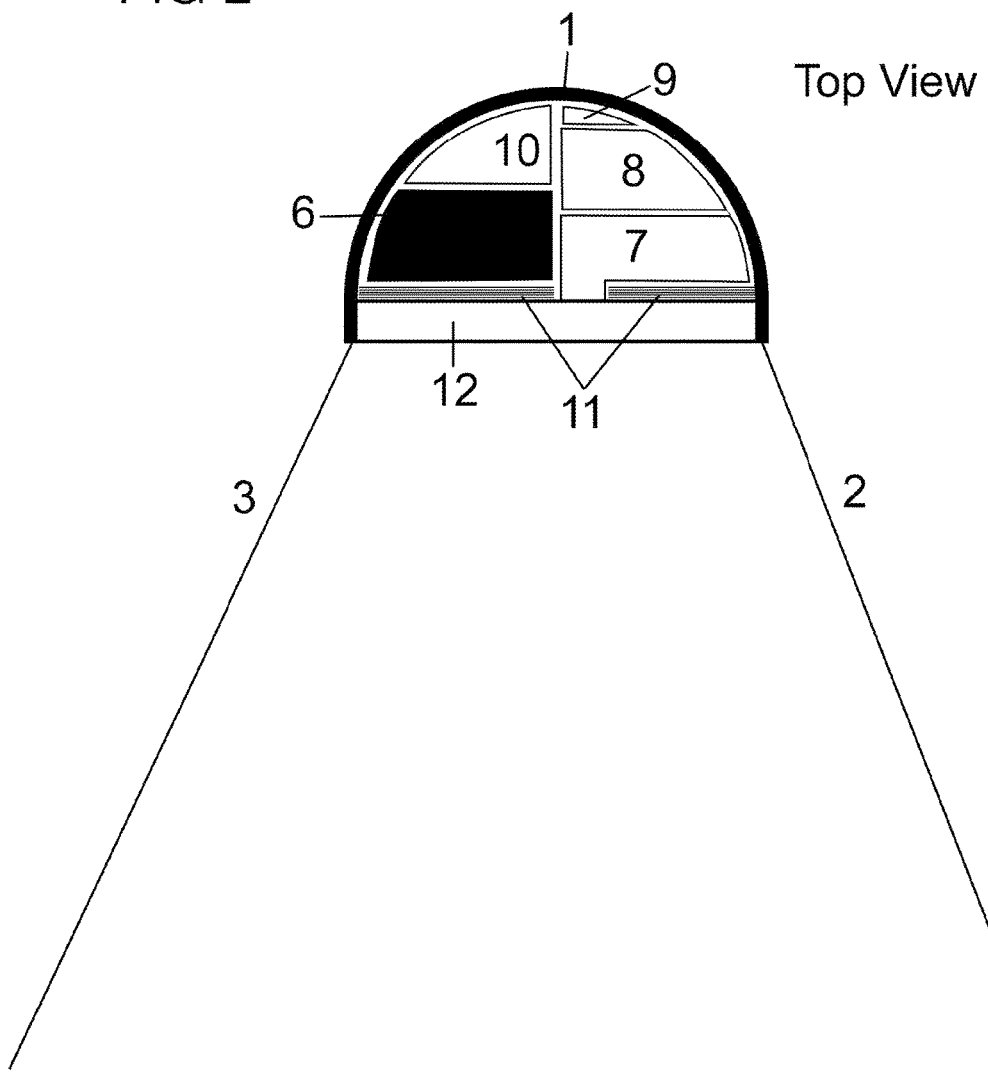

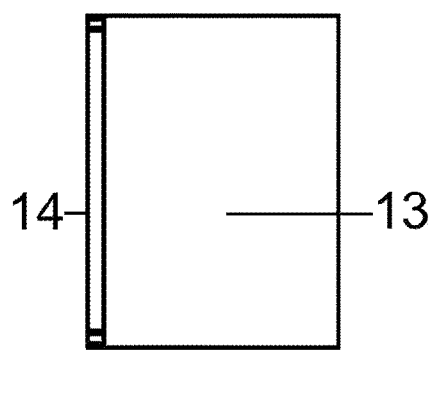
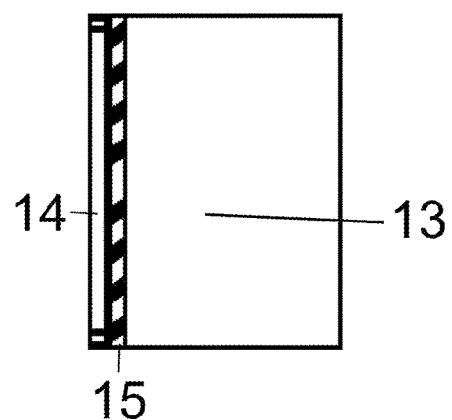
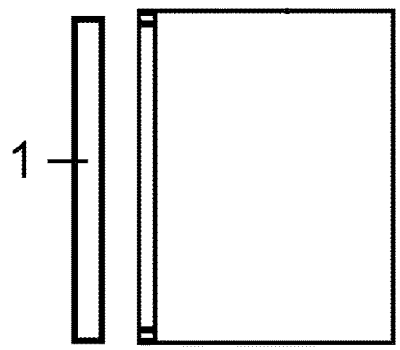
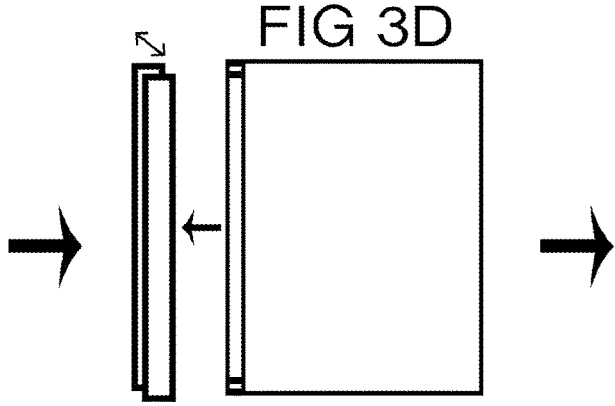
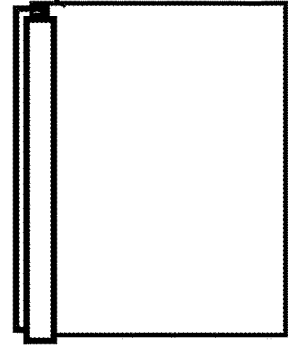
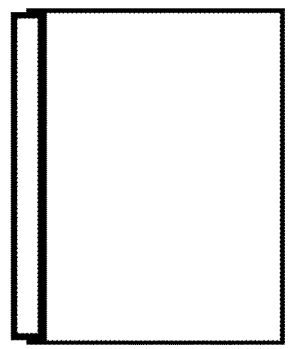

FIG 3G
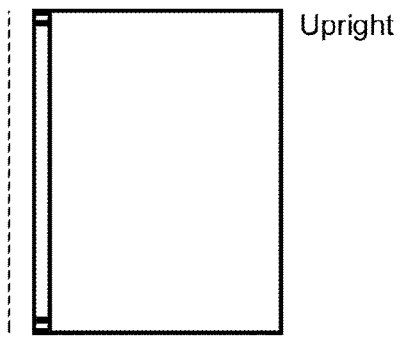
Upright
FIG 3H
Flat
FIG 3J
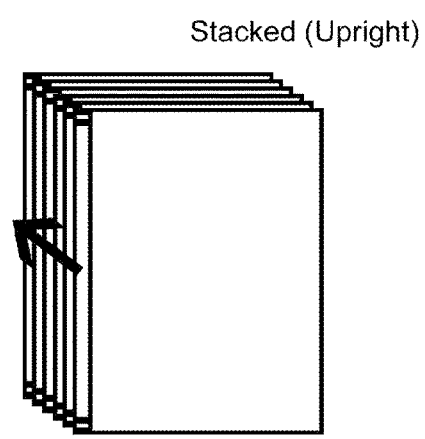
Stacked (Upright)
FIG 3I
Stacked
FIG 3K
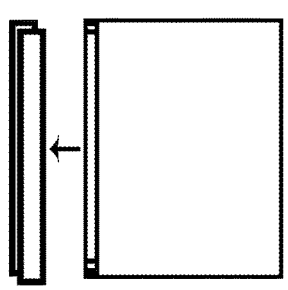
FIG 3L
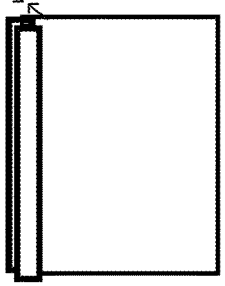
FIG 3M
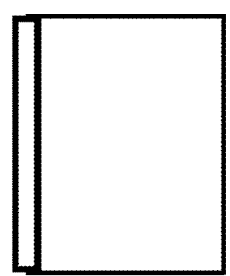

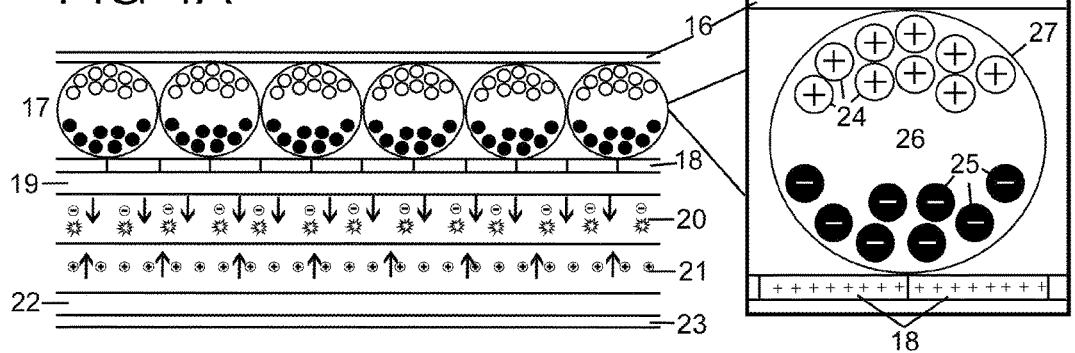
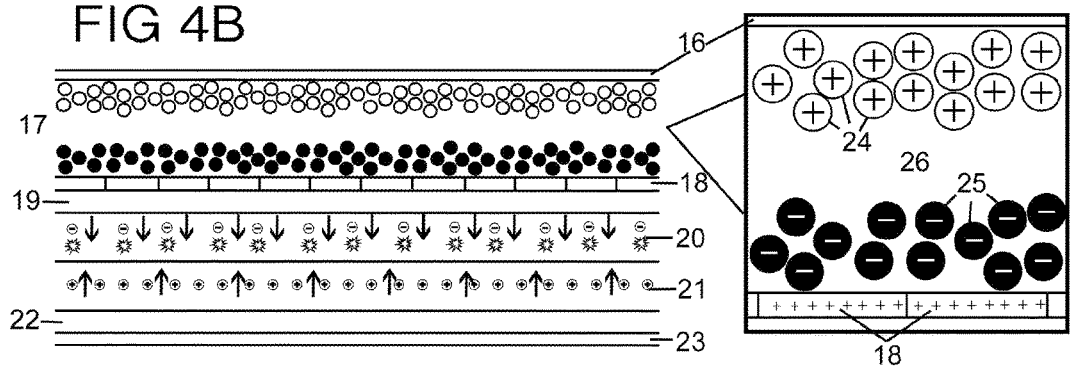

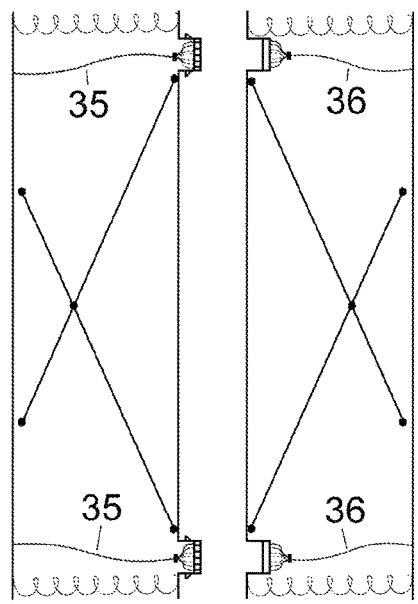
FIG 8A
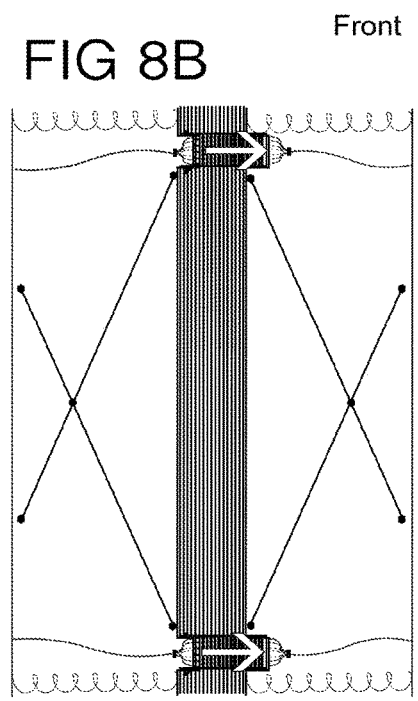
FIG 8B   Front
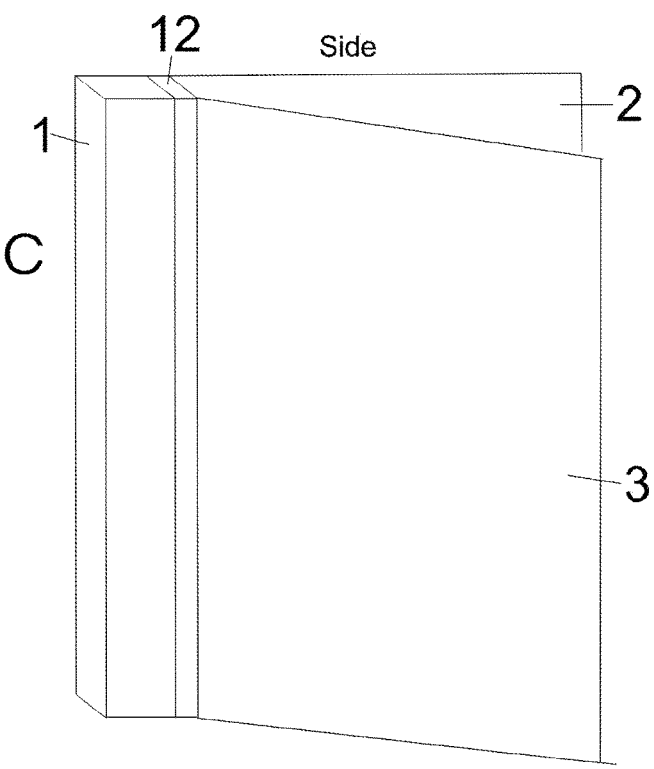
FIG 8C

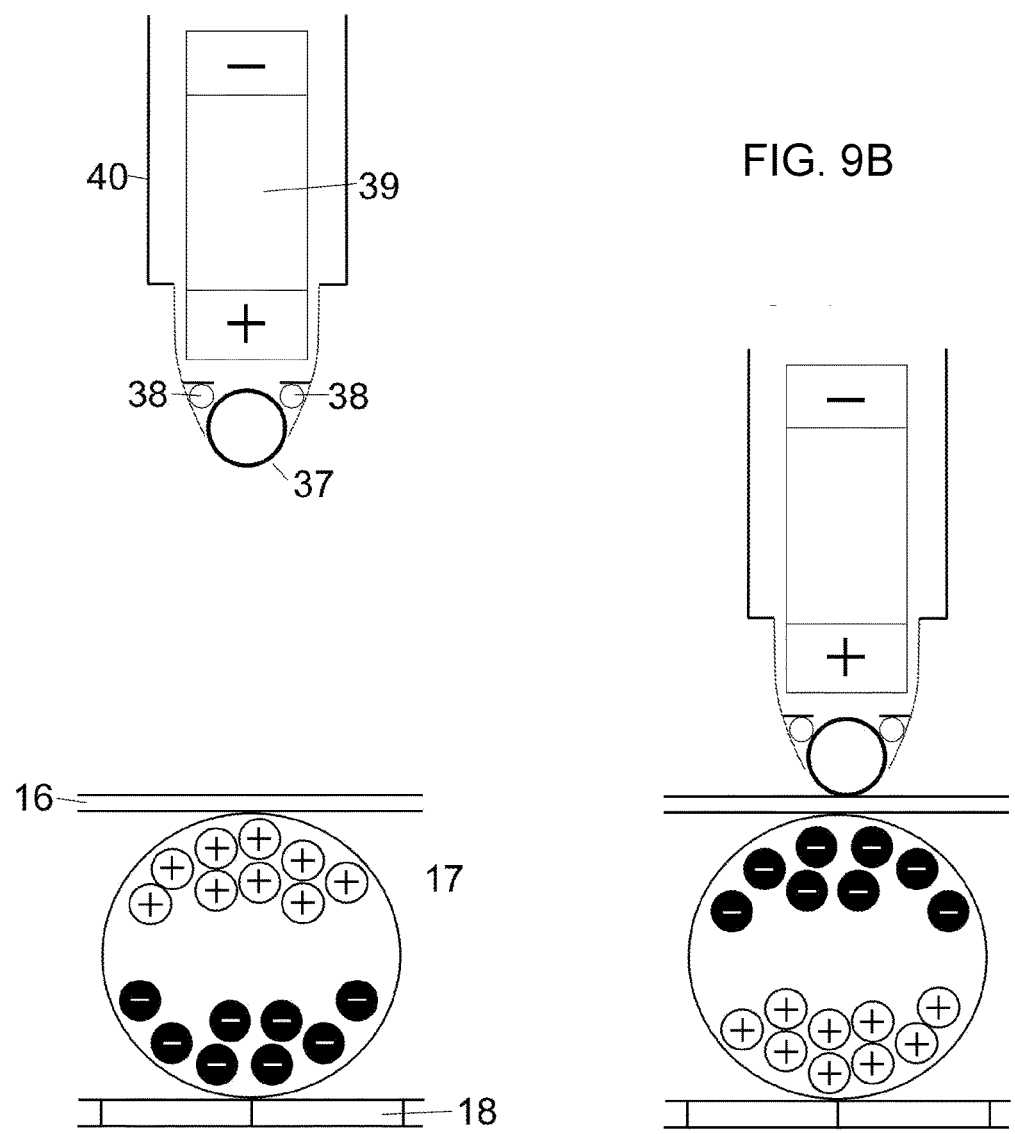

FIG. 11A
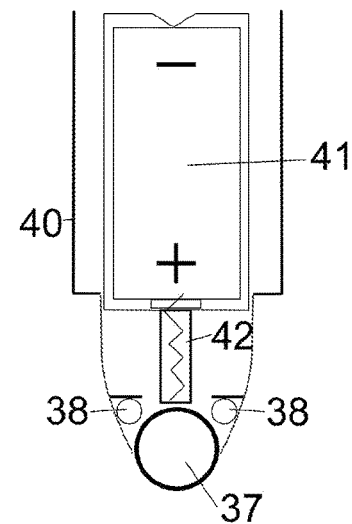
FIG. 11B
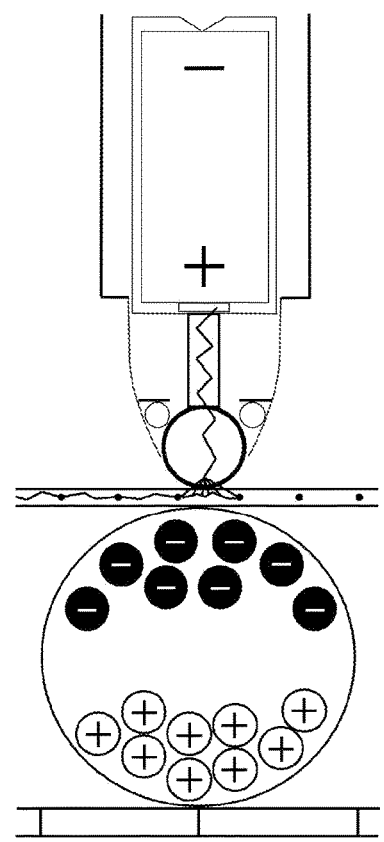
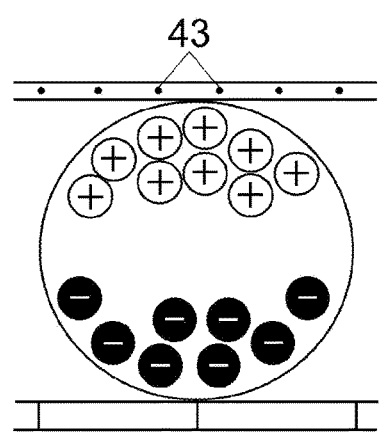

ELECTRONIC BOOK

BACKGROUND

Tablet computing devices have not only exploded in popularity, but both the form and function of these devices has advanced to where they rival traditional computers in terms of capabilities. In a classroom setting, for example, what was once done on paper may know be performed on a tablet computing device, and many users prefer the additional features provided by these devices. Handwriting recognition and conversion to text, sharing options, and multimedia features are just some of the examples.

Nevertheless, traditional paper-based notebooks and analog writing devices are preferred by many who find that the benefits of tablets are eclipsed by the shortcomings. For example, Tablet computing devices require a power source, which can become depleted at an inconvenient time. Depending on the make and model of the tablet the battery life may for only survive a few hours. Once the battery is depleted the tablet is useless until it is recharged again. This poses a problem to the mobility aspect of a tablet. Compared to a notebook, one can take the notebook anywhere without the fear of losing information and not being able to use it if the battery dies because a notebook does not require electricity to function.

Tablet computing devices can also be expensive, fragile, and awkward to operate. For example, the LED display used in many tablets smudges easily, does not work well in the sunlight, and is susceptible to cracking or shattering. LED screens in tablets can also be expensive to replace.

Tablet computing devices may also require an unfamiliar or awkward method of interaction with the device. When interacting with a tablet one may use their finger or a stylus. Using a finger to interact with the screen can detract from the precision that comes with using a pen on paper, making it difficult to take notes (without the keyboard) and to draw. Styluses have been proposed as an alternative, but the feeling of using the stylus on a glass screen may be uncomfortable to people who have written on paper their whole lives.

Where tablet computing devices are avoided, consumption of paper products can lead to environmental concerns such as deforestation. Deforestation without immediate reforestation poses a threat to our environment and is a major contributor to climate change. According to an article by the Environmental Protection Agency, pulp and paper mills are among the worst polluters to air, water and land. See 2015 Toxics Release Inventory National Analysis Report, https://www.epa.gov/trinationalanalysis/report-sections-2015-tri-national-analysis. Even though many efforts have taken place to increase recycling and the use of recycled paper, manufacturers still look to paper mills for their source of paper manufacturing.

Accordingly, what is needed is a portable computing device that simulates the experience of writing with a pen on paper, while still providing the traditional benefits of a tablet computing device and reducing reliance on paper goods, while minimizing or eliminating the problems discussed above.

BRIEF DESCRIPTION OF THE DRAWINGS

The features and advantages of the present disclosure may be more fully understood with reference to the following detailed description when taken in conjunction with the accompanying figures, wherein:

FIG. 1 displays an upright illustration of the spine component.

FIG. 2 displays a top view illustration of the spine and how the architecture of the hardware components may be positioned.

FIG. 3A-3F displays how a page (display component) may be connected to the spine, showing two different options.

FIG. 3G-3M displays how multiple pages (display component) may be stacked on top of one another and also displays that stack being connected to the spine component.

FIG. 4A displays the composition of the page and the use of ink gels divided by a capsule.

FIG. 4B displays the composition of the page and the ink gel flowing freely throughout the E-ink layer.

FIG. 8A-8C displays how the communication may travel from the spine and stacked pages. It also shows where the connection may be taking place relative to the spine.

FIG. 9A-9B displays the composition of the special pen using a magnet to change the position of the different colored ink gels.

FIG. 11A-11B displays the composition of the special pen using a battery to provide a current in order to communicate with the electrodes installed within the substrate to change the composition of the different colored ink gels.

DETAILED DESCRIPTION

Figure 5A:
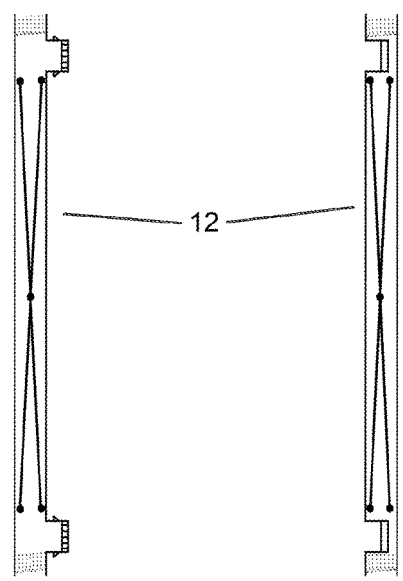
FIG. 5A-5D displays how a connected lock may be made when there are no pages connected to the spine.
Figure 5B:
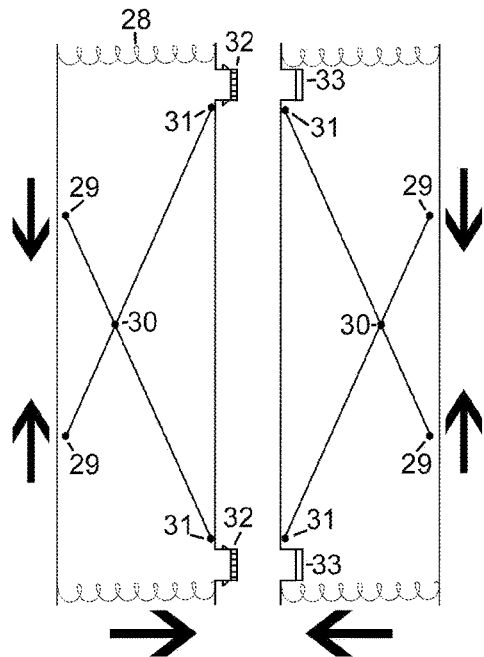
Figure 5C:
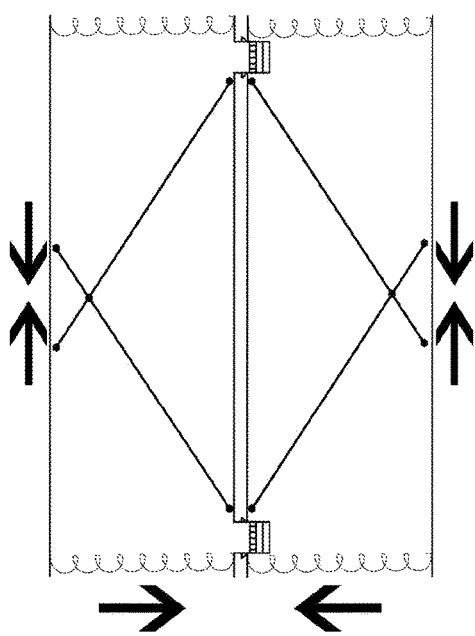
Figure 5D:
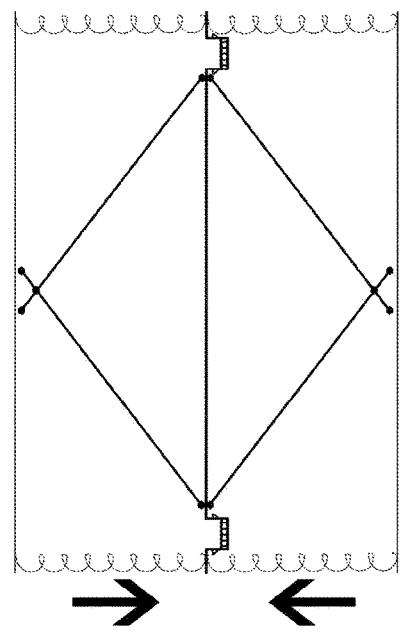

In embodiments, a device is disclosed comprising a spine (1) and a display (13). The spine (1) is the part of the device which contains all the main hardware like the motherboard/processing unit (7), battery (6), Wi-Fi antenna (9), memory (8), speakers (11), etc. as shown in FIG. 2. The spine (1) may also have attached to it the back cover (2) and front cover (3). Between the back and front cover there may be an area where the display can connect to the spine of the device known as the connection hub (12) located in FIG. 2. The display (13) may be composed of two main layers shown in FIG. 4A and FIG. 4B. One layer containing E-ink technology (17) and another layer containing OLED technology (19-22). When combined, users may be enabled to interact freely with the display rather than being limited to only E-ink or OLED display alone. The spine (1) may have the capability to hold more than one display as shown in FIG. 3I and FIG. 3J, and is meant to mimic a piece of paper made of wood. A pen may be provided for interacting with the device.

Spine:

The spine of an electronic book may contain the basic mobile device necessities such as a motherboard/processing unit (7), battery (6), Wi-Fi antenna (9), memory (8), speakers (11), and extra space (10) seen in FIG. 2. Attached to the spine may be the back cover (2) and front cover (3) of the Electronic book seen in FIG. 1. These covers may be made of different types of materials such as, but not limited to, leather or plastic.

Figure 6A:
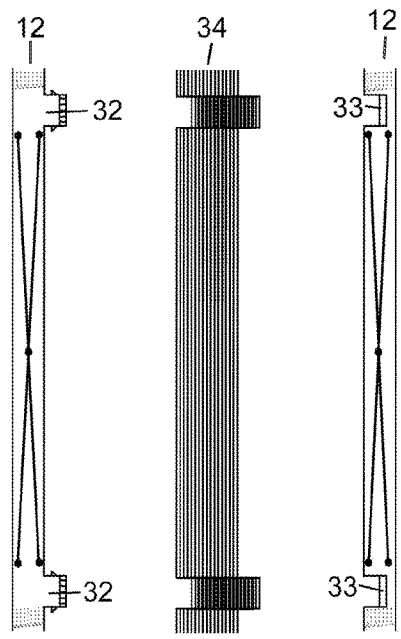
FIG. 6A-6B displays how a stack of pages (display components) may be connected to the display.
Figure 6B:
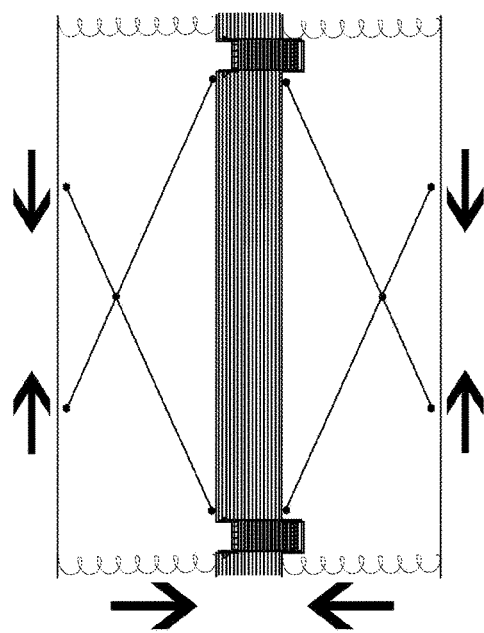
Figure 7A:
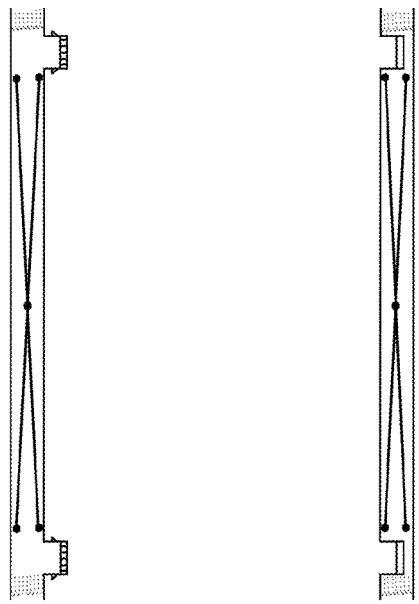
FIG. 7A-7D displays an alternative method shown in FIG. 5 of closing the locks together.
Figure 7B:
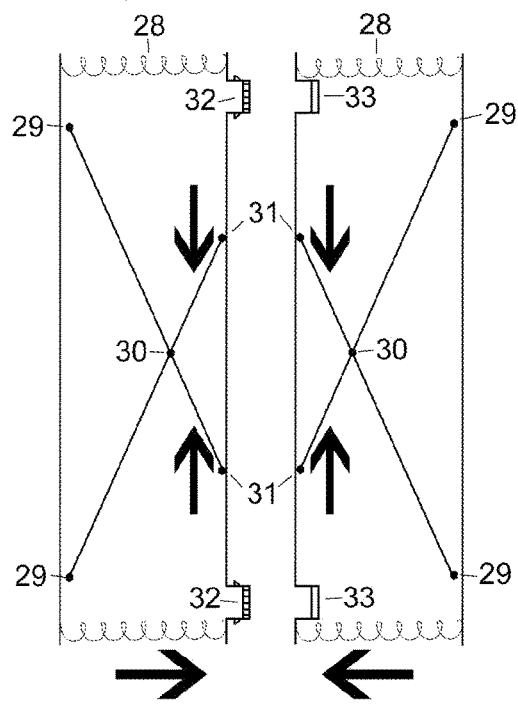
Figure 7C:
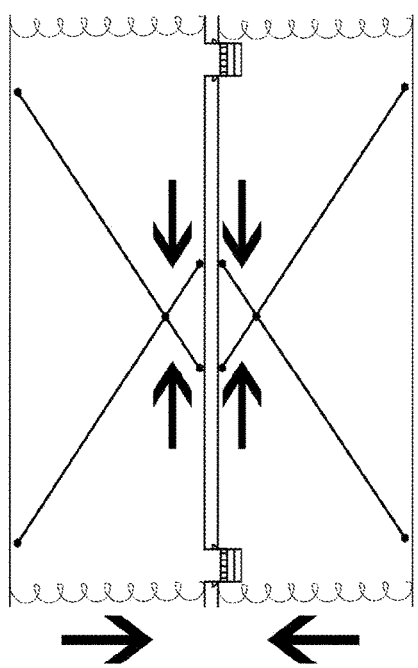
Figure 7D:
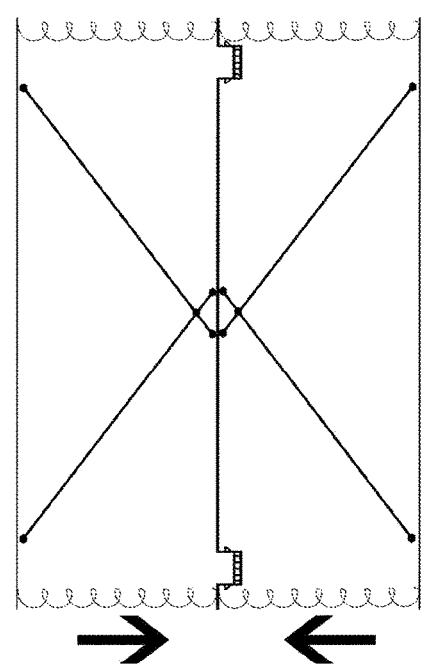

On the top of the spine there may be a button (4) as seen in FIG. 1. This may be a physical button that is pushed down or may not be physical and may be sensitive to touch, like a touchscreen that senses a finger on the surface area. The button (4) can be used for multiple purposes and when the button is active a light within the button may be activated. One purpose may be to activate the lock function. The lock function will lock the device from being used any further until it is unlocked. The device is unlocked as soon as the user activates the lock function again. Another purpose may be for page connection. An example of this special function may be in if the button (4) is pressed/activated twice, consecutively, then the connection hub to the displays (12) will unlock itself, unlock any displays connected to the device, and would open up being in the position of FIG. 5A. and FIG. 7A. Continuing with the same example, if the button (4) is pressed/activated twice, consecutively, again then the connection hub to the displays (12) will begin to close, locking any displays that are in between it as seen in FIG. 6A and FIG. 6B.

On the bottom of the spine (1) there may be one small port (5) seen in FIG. 1. This port may be used similarly to a universal port. This port will have many capabilities such as the ability to charge the device, to connect the device to a computer, to connect headphones to the device to transfer audio from the speakers to the headphones. The port will also be used for other functions to connect to the device.

In between the front and back cover may be the area where the display will connect to the spine known as the connection hub (12). The display (13) may be connected to the spine (1) by clipping it on to the connection shown in FIG. 3A-3F. The method of clipping the display into the connection may require the display (13) to have a stacking option in order to fit multiple display units for the spine (1) as shown in FIG. 3I and FIG. 3J. When the user wants to lock the stacked displays together, the displays may be placed in between the connection hub. As the connection closes it will lock the displays in place, connecting the input to display connector (32) to the displays (34), and the displays (34) to the output from displays connector (33) seen in FIG. 6A and FIG. 6B. The connection hub can be closed in many ways. FIG. 5A-5D shows the connection hub closing together by moving the outer pivots (29) closer to each other, keeping the inner pivots (31) at a fixed position on the end of the connection hub (12), pushing the two ends of the connection hub together to close. The springs (28) are present to assist with the closing of the connection hub (12). The final position of the closed connection hub (12) can be seen in FIG. 5D. The movement of the outer pivots (29) may be controlled by the user, giving the user to open and close the connection hub (12). FIG. 7A-7D displays another method of closing the connection hub (12). The only difference between FIG. 5A-5D and FIG. 7A-7D are that in FIG. 7A-7D the outer pivots (29) are at a fixed location and the inner pivots (31) move closer to each other, closing the connection hub (12), seen in FIG. 7D.

The electrical wires connecting the displays to the spine and vice versa can been seen in FIG. 8A-8C. In FIG. 8A there are two different sets of wires present, the input wires (35) and the output wires (36). The input wires (35) may be responsible for sending information from the spine (1) to the displays (34). The output wires (36) may be responsible for sending information from the displays (34) back to the spine (1). The path of traveling information within the device is displayed in FIG. 8B.

Display:

The display may be composed of a combination of E-ink and OLED technology. The display being used for this device may be made to mimic a typical piece of paper in looks and feel. In order for this to achieved, the substrate (16) (23) that may be used to enclose the E-ink and OLED layers, seen in FIG. 4A-4B, may be composed of a bamboo-based polymer or a wood-based polymer. The display may be designed to stack on one another shown in FIG. 3I FIG. 3J. This may allow multiple displays to be connected to the spine (1) of the device. The display (13) may contain an area composed of tethered cloth (15) shown in FIG. 3B. This may be to add flexibility to the display in order to keep the feeling of using real paper.

In embodiments, a display comprises with the layer utilizing E-ink technology (17). This layer may contain both black (25) and white (24) gel/capsules/chips that may have a different charge. The black gel/capsules/chips (25) may be negatively charged while the white gel/capsules/chips (24) may be positively charged or vice versa. These gel/capsules/chips may move along in a clear gel (26). The clear gel may be enclosed in a greater capsule (27) as seen in FIG. 4A. The black (25) and white gel/capsules/chips (24) may also flow freely throughout the E-ink layer (17) as seen in FIG. 4B. Enclosing the capsules may be the top electrode (16), which may be either the bamboo-based polymer or the wood-based polymer, and the bottom electrode (18). The bottom electrode (18) may be where the charge can change in to manipulate what is displayed by the E-ink (17) through the top electrode (16). The bottom electrode (18) may be manipulated by the spine (1) or by action of using a special modified pen (40). If the bottom electrode (18) is positive, then the negatively charge black gel/capsules/chips (25) may be attracted to the bottom while the positively charged white gel/capsules/chips (24) may be pushed to the top as seen in FIG. 4A-4B. This may make that area of the display look white. And if the bottom electrode (18) is negative, then the negatively charge black gel/capsules/chips (25) may be pushed to the top while the positively charged white gel/capsules/chips (24) may be attracted to the bottom. This may make that area of the display look black. The special modified pen (40) used for the device may be able to manipulate the bottom electrode (18) to change the color shown by the E-ink layer (17).

The next layer of the display in FIG. 4A-4B may be composed of organic light-emitting diodes or OLEDs (19-21). The OLED layer (19-21) may be composed using techniques common in the field of OLED display composition containing, by order from top to bottom, a cathode layer (19), an emissive layer (20), a conductive layer (21), and an anode layer (22). The top of the cathode (19) may have attached to it the bottom electrode (18) of the E-ink layer, combining the two layers together. This could be done by an adhesive. This may also be done by constructing the cathode (19) and the bottom electrode (18) of the E-ink layer together in the manufacturing process. The bottom substrate layer (23) composed of a bamboo-based polymer or a wood-based polymer may be right below the anode (22). The light (photons) emitted from the OLED layer may be adjusted so the light (photons) may be visible past the black

(25) and white gel/capsules/chips (24) in the E-ink layer. Another method of making the light (photons) visible through the E-ink layer (17) may be to make the E-ink layer (17) thinner.

Activation of the E-Ink Layer:

The E-ink layer (16) could be controlled by the user or the spine (1). The user would have the ability to control the black (25) and white gel/capsules/chips (24) via a special pen (40). The spine (1) would have the ability to control the black (25) and white gel/capsules/chips (24) using the bottom electrode (18) from information sent from the spine, travelling through the input wires (35) and input to display (32), to the display (13). The bottom electrode (18) may control what is seen to the user by changing the charge of the bottom electrode (18) changing the position of the black (25) and white gel/capsules/chips (24).

Activation of the OLED Layer:

The OLED layer could be controlled by the user or the spine (1). The user would have the ability to control the OLED layer via a special pen (40). The spine (1) would have the ability to control the electrons being released from the cathode layer from information sent from the spine, travelling through the input wires (35) and input to display (32), to the display (13).

Figure 10A:
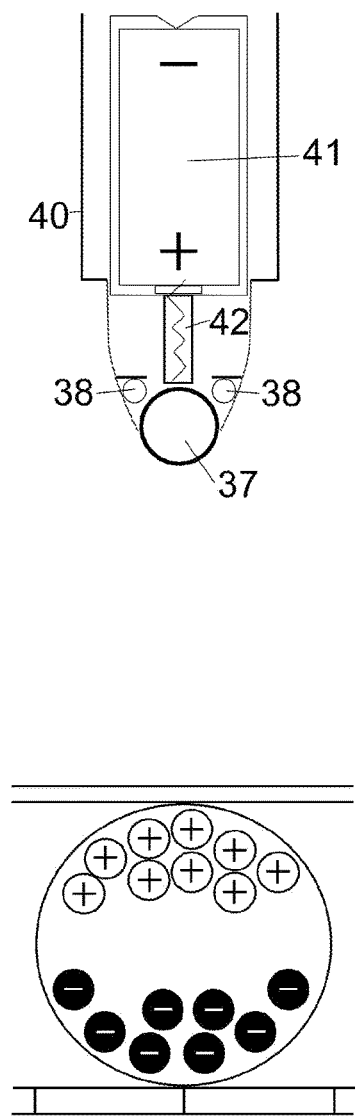
FIG. 10A-10B displays the composition of the special pen using a battery to provide a current to communicate with the page component to change the composition of the different colored ink gels.
Figure 10B:
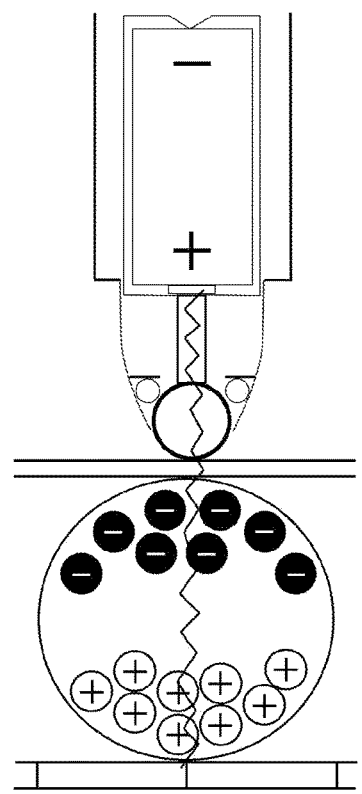
Figure 12A:
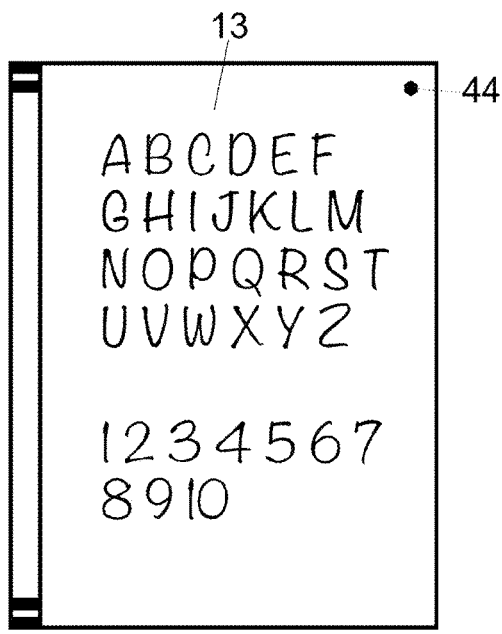
FIG. 12A-12B displays an example of how the E-ink layer alone may look on the page (display component).
Figure 12B:

Pen Interaction with E-Ink:

A special pen (40) may allow the user to interact with the display (13). The pen may interact with the E-ink layer (17) in different ways. The purpose of the pen (40) may be to allow the user to bring the black gel/capsules/chips (25) above the white gel/capsules/chips (24). This may allow the pen (40) to act as if it is writing in black ink. The pen (40) can use different ways to change the pigment of the E-ink layer (17). One way is shown in FIG. 9A-9B where the pen (40) may contain a magnet (39). This magnet (39) may create a magnetic field used to directly attract the black gel/capsules/chips (25). The bottom electrode (18) of the E-ink layer (17) may detect a forced change in polarization and may send that message back to the spine (1) carrying the information from the output from display (33), through the output wires (36), to the spine (1). The spine (1) may then send information to display (13) commanding the bottom electrode (18) to change from having a positive to having a negative charge or vice versa in order to make sure that the black gel/capsules/chips (25) remain in that same position. This may allow the spine (1) to recognize when a pen (40) is being used. Another method to change the pigment of the E-ink layer (17) may be to use an electric charge shown in FIG. 10B. A battery (41) may be contained within the pen (40) to store the electricity. When the pen (40) is being used on the top substrate (16), the ball point (37) creates a bridge between the conductive rod (42), which is what is extending the current from the battery, and the top substrate (16) shown in FIG. 10B. The current then makes it to the bottom electrode (18) where a voltage drop may be detected. The display (13) may send that information to the spine (1), and then the spine (1) may send information back to the display (13), where the bottom electrode (18) may change charge to change the pigment of the E-ink layer (17). Another method, similar to FIG. 10A-10B, may also use an electric charge. FIG. 11A shows the pen (40) seen in FIG. 10A-10B but instead of the current being detected at the bottom electrode (18), it may be detected at the top substrate (16). This may be done by embedding electrodes within the substrate (43) which may be able to directly detect any voltage drop, as seen in FIG. 11B. The electrodes within the substrate (43) may then send the information to the spine (1) and the spine may send information back to bottom electrode (18). Other methods of changing the pigment of the e-ink layer may be similar to the methods recently stated (FIGS. 9-11). The ball point (37) may be added to give the pen (40) a smooth feel, the same way a ball point pen feels on paper. The secondary ball (38) may give the ball point an extra smooth feel and may also help it keep its position within the shell of the pen (40). An example of the pen's (40) interaction with the display (13) may be seen in FIG. 12A-12B.

Figure 13A:
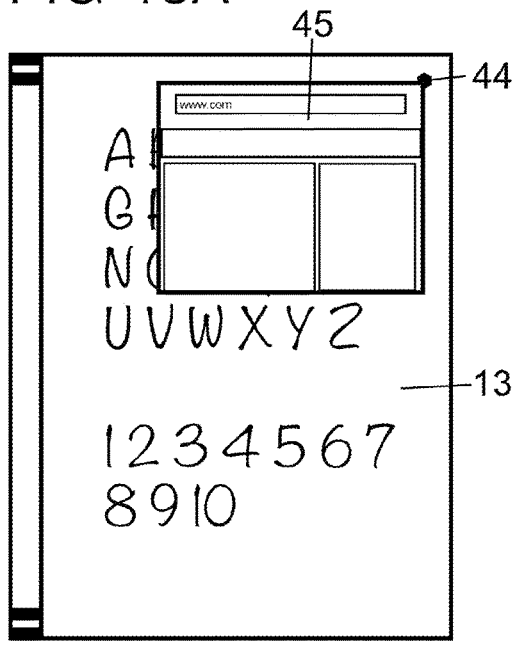
FIG. 13A-13D displays an example of how the E-ink layer and the organic led layer may look when it is activated together (display component).
Figure 13B:
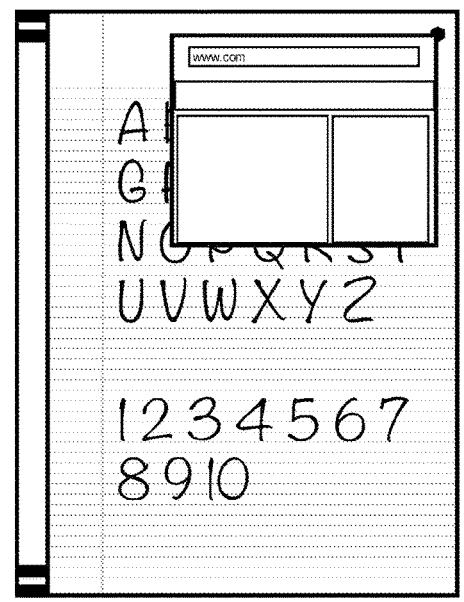
Figure 13C:
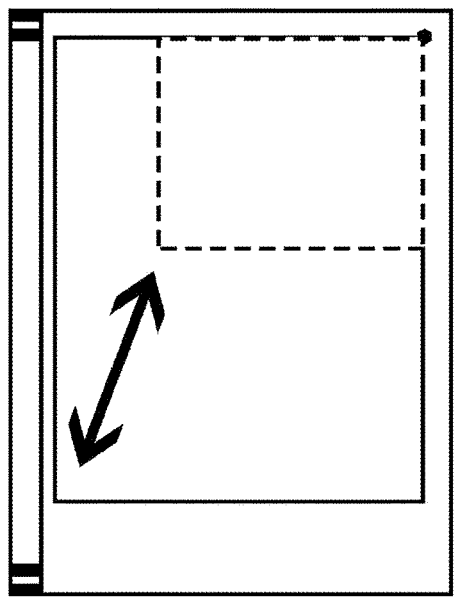
Figure 13D:
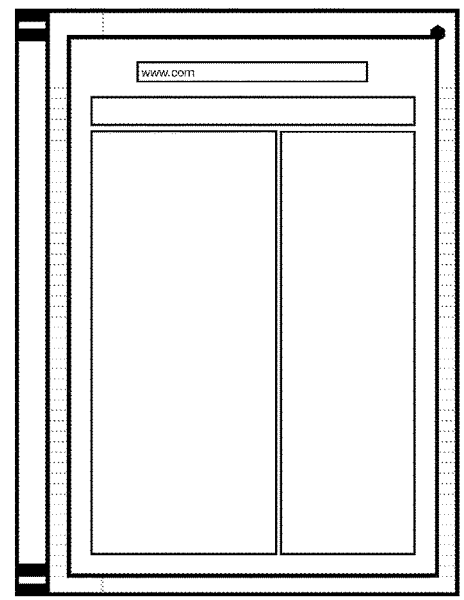
Figure 14A:
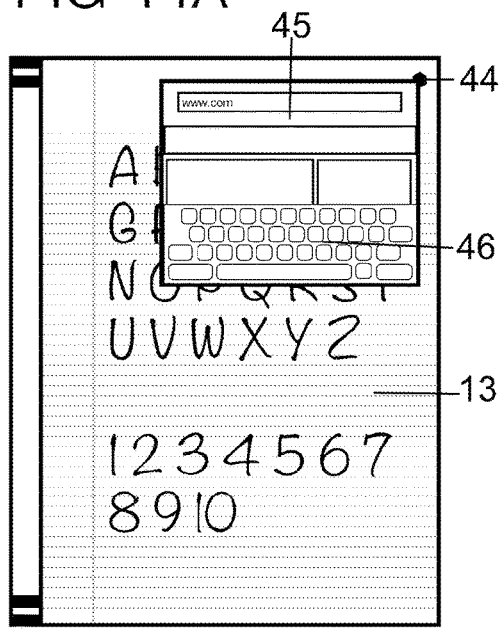
FIG. 14A-14C displays the keyboard interface that may be displayed when a user wants to enter information in the area where the organic led layer is activated.
Figure 14B:
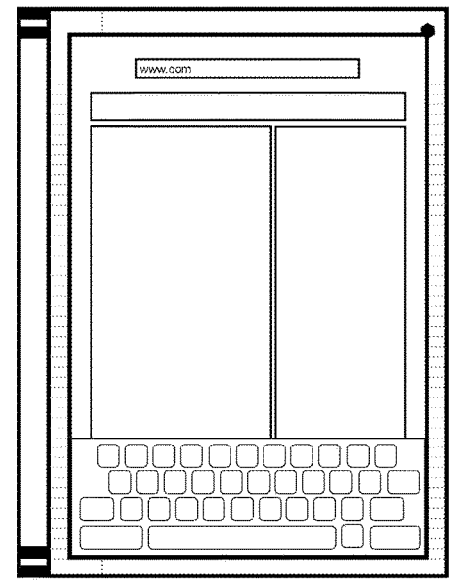
Figure 14C:
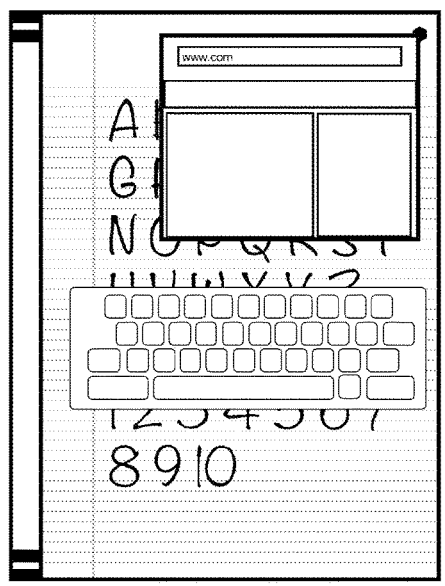

Pen Interaction with OLED:

When the user wants to activate the OLED layer of the display (13) the pen (40) may have to placed/pressed on the OLED screen activation area (44), shown in FIG. 13A-13D. When the pen (40) is place/pressed over the OLED screen activation area (44) the bottom electrode (18) senses that the pen (40) is being used there, but instead of changing the charge of the bottom electrode (18) it may send information to the spine (1) directing it to activate the OLED layer of the display (13). When the OLED layer is activated the E-ink layer will automatically force the black gel/capsules/chips (25) to the bottom and the white gel/capsules/chips (24) to the top of the E-ink layer (17). If the user may want to turn off the OLED layer and return to using the E-ink layer (17) then the spine (1) may have kept a memory of what was present in the E-ink layer (17) before activation of the OLED layer and restore it. To turn off the OLED layer the user must place/press the pen (40) on the OLED screen activation area (44) again. FIG. 13A-13D shows the display with both the E-ink layer (17) and the OLED layer activated at the same time. The OLED layer may be used to access applications such as a web browser, shown in FIGS. 13A and 13B. The size of screen for the OLED layer may be adjusted to the page as seen in FIG. 13C. When using the OLED layer, the pen (40) may be used as an ordinary cursor. If the user may like to type anything a keyboard (46) may be displayed within the limits of the OLED display area. The keyboard function can be seen in FIG. 14A-14C. As the size of the OLED area increases so may the size of the keyboard (46). The user may also be able to drag the keyboard off of the OLED display area seen in FIG. 14C.

It may be understood that there are numerous modifications of the illustrated embodiments described above which may be readily apparent to one skilled in the art, including any combinations of features disclosed herein that are individually disclosed or claimed herein, explicitly including additional combinations of such features. These modifications and/or combinations fall within the art to which this invention relates and are intended to be within the scope of the claims, which follow. It is noted, as is conventional, the use of a singular element in a claim is intended to cover one or more of such an element.

I claim:

1. An electronic book device comprising:
a longitudinal spine defining a housing for containing a microprocessor, wireless transceiver, and power supply;
at least one display panel comprising comprise a plurality of display layers stacked atop a substrate, wherein a first display layer is substantially transparent, and is positioned above a second display layer that is responsive to user input;
a connection hub attached to said longitudinal spine and configured to removably attach to said at least one display panel such that said display panel is in communication with said longitudinal spine;
wherein said display layers are activated by said microprocessor in response to user input; and wherein said first display is deactivated and said second display is activated in response to a user gesture.

2. The electronic book device of claim 1 wherein said plurality of display layers comprises a microencapsulated electrophoretic display and an organic light-emitting diode display.

3. The electronic book device of claim 2 wherein said substrate is configured to detect an external device interacting with said display panel.

4. The electronic book device of claim 3 wherein said substrate is configured to detect an external magnetic field.

5. The electronic book device of claim 3 wherein said substrate is configured to detect an external electrical field.

6. The electronic book device of claim 3 wherein said signal is an electronic pen.

7. The electronic book device of claim 1 wherein said connection hub comprises a plurality of pivots configured to secure said display panel to said spine.

8. The electronic book device of claim 1 wherein said plurality of display layers comprises a microencapsulated electrophoretic display and organic light-emitting diode display.

9. The electronic book device of claim 1 wherein said substrate is made from one of a wood-based polymer or a bamboo-based polymer.

10. The electronic book device of claim 1 further comprising front and back cover portions connected to said spine.

11. An electronic book device comprising:
a longitudinal spine defining a housing for containing a microprocessor, wireless transceiver, and power supply;
at least one display panel comprising a first substantially transparent display means and a second display means substantially positioned behind said first display means;
a substrate for supporting said first and second display means;
means for removably connecting said at least one display panel to said spine; and
means for selectively activating or deactivating said first substantially transparent display means in response to user input.

* * * * *